US012678947B2

(12) United States Patent
Dayeh et al.

(10) Patent No.: US 12,678,947 B2
(45) Date of Patent: Jul. 14, 2026

(54) TACTILE SENSOR ARRAY ON FLEXIBLE SUBSTRATE WITH PIEZOELECTRIC TFT TACTILE SENSOR

(71) Applicant: THE REGENTS OF THE UNIVERSITY OF CALIFORNIA, Oakland, CA (US)

(72) Inventors: Shadi A. Dayeh, San Diego, CA (US); Hongseok Oh, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 834 days.

(21) Appl. No.: 18/040,372

(22) PCT Filed: Aug. 4, 2021

(86) PCT No.: PCT/US2021/044520
§ 371 (c)(1),
(2) Date: Feb. 2, 2023

(87) PCT Pub. No.: WO2022/035659
PCT Pub. Date: Feb. 17, 2022

(65) Prior Publication Data
US 2023/0271320 A1     Aug. 31, 2023

Related U.S. Application Data

(60) Provisional application No. 63/065,075, filed on Aug. 13, 2020.

(51) Int. Cl.
B25J 9/16          (2006.01)
B25J 19/02          (2006.01)
(Continued)

(52) U.S. Cl.
CPC .......... B25J 9/1633 (2013.01); B25J 19/028 (2013.01); H10N 30/302 (2023.02);
(Continued)

(58) Field of Classification Search
CPC ...... H10N 39/00; H10N 30/87; H10N 30/302; H10N 30/802; H10N 30/853; H10N 30/883; B25J 9/1633; B25J 19/028
See application file for complete search history.

(56) References Cited

U.S. PATENT DOCUMENTS

| | | |
|---|---|---|
| 2014/0247231 A1 | 9/2014 | Lin |
| 2016/0240766 A1 | 8/2016 | Al Ahmad et al. |
| 2021/0175283 A1 | 6/2021 | Wang et al. |

OTHER PUBLICATIONS

Lee, et al., "A transparent bending-insensitive pressure sensor", Nature Nanotechnology, 2016, vol. 11, pp. 472-479.
(Continued)

*Primary Examiner* — Emily P Pham
*Assistant Examiner* — Monica Mata
(74) *Attorney, Agent, or Firm* — Greer, Burns & Crain, Ltd.; Steven P. Fallon

(57) ABSTRACT

A flexible thin film transistor tactile sensor includes a piezoelectric semiconductor thin film channel of material whose conductivity can be electrostatically controlled connected with source and drain metals and sandwiched between bottom and top thin film insulators and at least one of a bottom and top gate metal, the sensor being supported on a flexible substrate. The piezoelectric property of the used material transduces pressure to electronic charge. The semiconductor property of the used material permits electrostatic modulation of the conductivity in TFT device architecture such that the device can be switched on and off. Transistor action provides gain for input signals, i.e., a modulation of the gate voltage induces strong current change between the source and drain, which can be leveraged to amplify the response to input pressure. The transistor forms the basis for sensor arrays, which are readily scalable to large size.

22 Claims, 15 Drawing Sheets

(51) Int. Cl.

| | |
|---|---|
| *H10N 30/30* | (2023.01) |
| *H10N 30/80* | (2023.01) |
| *H10N 30/853* | (2023.01) |
| *H10N 30/87* | (2023.01) |
| *H10N 30/88* | (2023.01) |
| *H10N 39/00* | (2026.01) |

(52) U.S. Cl.
CPC ......... *H10N 30/802* (2023.02); *H10N 30/853* (2023.02); *H10N 30/87* (2023.02); *H10N 30/883* (2023.02); *H10N 39/00* (2023.02)

(56) References Cited

OTHER PUBLICATIONS

Park, et al., "Si membrane based tactile sensor with active matrix circuitry for artificial skin applications", 2015, Appl. Phys. Lett., pp. 043502-1-043502-4.

Mshniakou, Siarhei, "Zinc Oxide Thin Film Transistor Pressure Sensors", Doctoral dissertation, UC San Diego, 2016, pp. 2, 3, 20, 48, 115; Fig. 2.4, 3.1, 7.1.

International Search Report from the corresponding International Patent Application No. PCT/US2021/044520, dated Oct. 5, 2021.

$$\vec{F}_{shear} \propto \sum (F_{ij} \cdot \vec{u}_{ij})$$

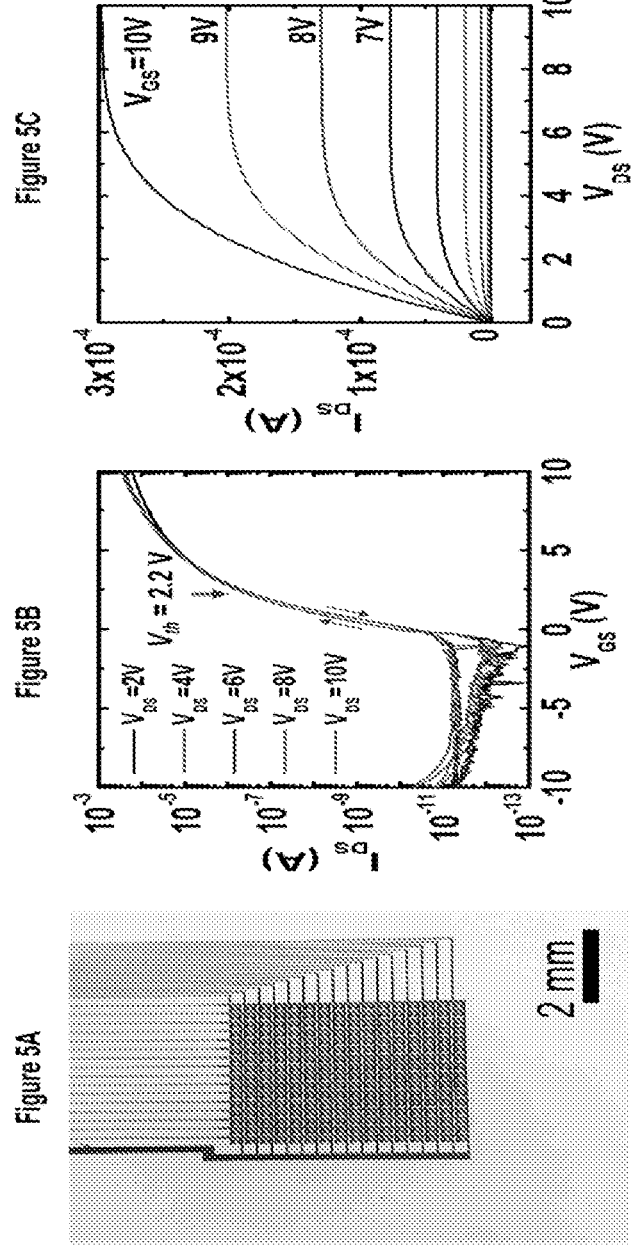

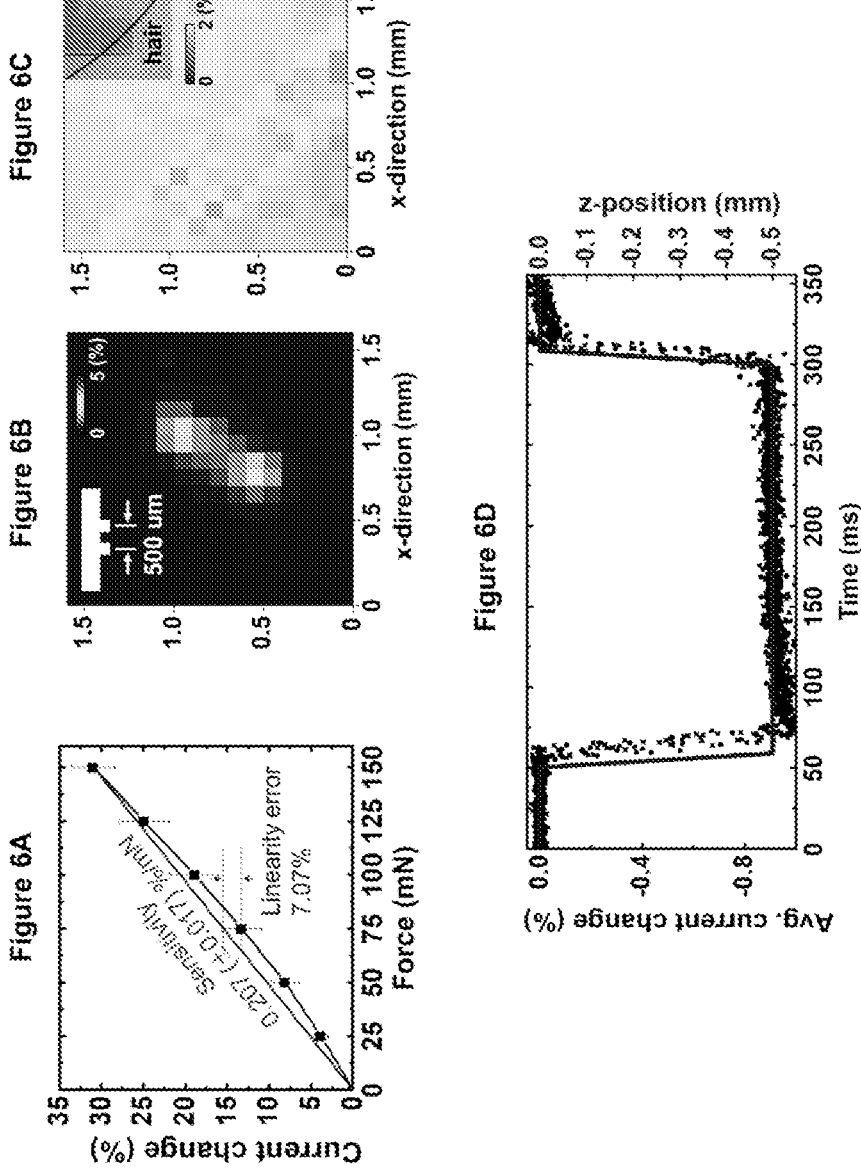

TACTILE SENSOR ARRAY ON FLEXIBLE SUBSTRATE WITH PIEZOELECTRIC TFT TACTILE SENSOR

PRIORITY CLAIM AND REFERENCE TO RELATED APPLICATION

The application claims priority under 35 U.S.C. § 119 and all applicable statutes and treaties from prior U.S. provisional application Ser. No. 63/065,075 which was filed Aug. 13, 2020.

FIELD

A field of the invention is sensors, and particularly tactile sensors. The invention has application, for example to electronic device interfaces and robotics.

BACKGROUND

The demand for flexible force sensor arrays is increasing in applications such as robotics, computer devices, smart phones, tablets, customer input devices in commercial applications and various electronic gadgets and interactive devices, such as gaming devices and systems. In such applications, tactile information and electromechanical interaction are important.

To achieve force sensation in a flexible form factor, passive-matrix piezoresistive sensor arrays are typically used on flexible substrates. Passive-matrix piezoresistive sensor arrays are advantageous in structural simplicity, but important factors such as signal-to-noise ratio, cross-talk, or response speed are limited by the size of the array, so-called Alt and Pleshko's "Iron Law of Multiplexing". The conflict between desirable properties and array size make it very difficult to scale up passive-matrix piezoresistive sensor arrays while maintaining the desirable performance and high spatiotemporal resolution.

Some researchers have reported flexible active-matrix pressure sensor arrays. These arrays combine organic TFTs or mechanically transferred Si transistors with piezoresistive sensors. Organic TFTs have limited switching speeds attributable to limited carrier mobility available in the organic materials. Si transistors can achieve required switching speed, but the transfer process is highly complicated, which greatly increase the production cost.

Passive piezoresistive sensor arrays have been commercially adapted. A description of an example commercial product can be found at Tekscan, Inc. https://www.tekscan-.com/tactile-pressure-sensors. Another is the QTC® SP200 Series from Peratech Holdco Limited. In this type of device, m×n arrays for example, m top electrodes and n bottom electrodes are prepared at the peripheries of the flexible panel. Since the top and the bottom electrodes to each element are normal to each other, there are m×n junctions. Piezoresistive material is sandwiched in between these panels as a channel material. The channel is formed at every junction, resulting in m×n pixels. The pixel is located at i-th row and j-th column and is addressed by applying positive and negative bias to i-th row and j-th column, while maintaining other top and bottom electrodes at the ground potential. The current level is measured, then compared to the baseline current without force. The change of the current indicates the applied force at the pixel of interest. By sequentially scanning the rows and columns, the force distribution over entire array can be achieved. Limitations of these type of sensors include limited signal-to-noise ratio, slow response time, ghosting effects (blurry or faded response that follows after large signals), and high power consumption. These limitations get worse when the size of array becomes larger.

Flexible active matrix pressure sensor arrays are usually made of multiplexing transistors (organic TFT [S. Lee et al., "A transparent bending-insensitive pressure sensor," *Nat. Nanotechnol.,* 2016] or Si transistor [M. Park, M. S. Kim, Y. K. Park, and J. H Ahn, "Si membrane based tactile sensor with active matrix circuitry for artificial skin applications," *Appl. Phys. Lett.,* 2015]) and of piezoresistive sensors. In these devices, each pixel is composed of one transistor and one sensor, which forms an "active matrix" structure. Here, m drain electrode and n gate electrodes form data and bit lines. To address the pixel located at i-th row and j-th column, first the j-th gate electrode is biased to turn on the transistors in the same line, and the current through the i-th row is measured. By calculating the current change, the amount of applied force can then be calculated. The large number of transistors makes these devices complex, expensive and power-hungry, especially when scaled up.

The current state-of-the-art technology cannot address the conflicting requirements of flexibility, power consumption, high spatial density, response speed and strong sensitivity for particularly demanding applications that include large sensor arrays, such as robotics. As a result, closed loop robotic systems employing a single transducer for grip and slip control are not present to date.

SUMMARY OF THE INVENTION

A preferred embodiment provides a flexible thin film transistor tactile sensor includes a piezoelectric semiconductor thin film channel of material whose conductivity can be electrostatically controlled connected with source and drain metals and sandwiched between bottom and top thin film insulators and at least one of a bottom and top gate metal, the sensor being supported on a flexible substrate. The piezoelectric property of the used material transduces pressure to electronic charge. The semiconductor property of the used material permits electrostatic modulation of the conductivity in TFT device architecture such that the device can be switched on and off Transistor action provides gain for input signals, i.e., a modulation of the gate voltage induces strong current change between the source and drain, which can be leveraged to amplify the response to input pressure. The transistor forms the basis for sensor arrays, which are readily scalable to large size.

BRIEF DESCRIPTION OF THE DRAWINGS

FIG. 1 is a schematic cross-sectional diagram of a preferred embodiment thin film transistor sensor device of the invention;

FIGS. 4A-4B show a structure to add shear force sensing to the FIG. 1 thin film transistor sensor;

FIG. 5A is an image of an experimental array 16×16 active-matrix force sensor array with a pitch of 100 μm to 500 μm in accordance with FIGS. 1, 3 and 4A-4C; FIG. 5B shows transfer curves; and FIG. 5C the output curves of experimental TFT sensors fabricated with ZnO piezoelectric thin film;

FIG. 6A shows the force response of 9 randomly selected spots of the FIG. 5A experimental array; FIG. 6B shows detection and resolution of two pressure points with a spacing of 500 μm; FIG. 6C shows detection and resolution of a hair on top of the sensor array by a glass slide; FIG. 6D shows the z-position of the force applicator in a line plot, and the corresponding response of the sensors of interest in a scatter plot over multiple cycles.

DETAILED DESCRIPTION OF THE PREFERRED EMBODIMENTS

Figure 2A:
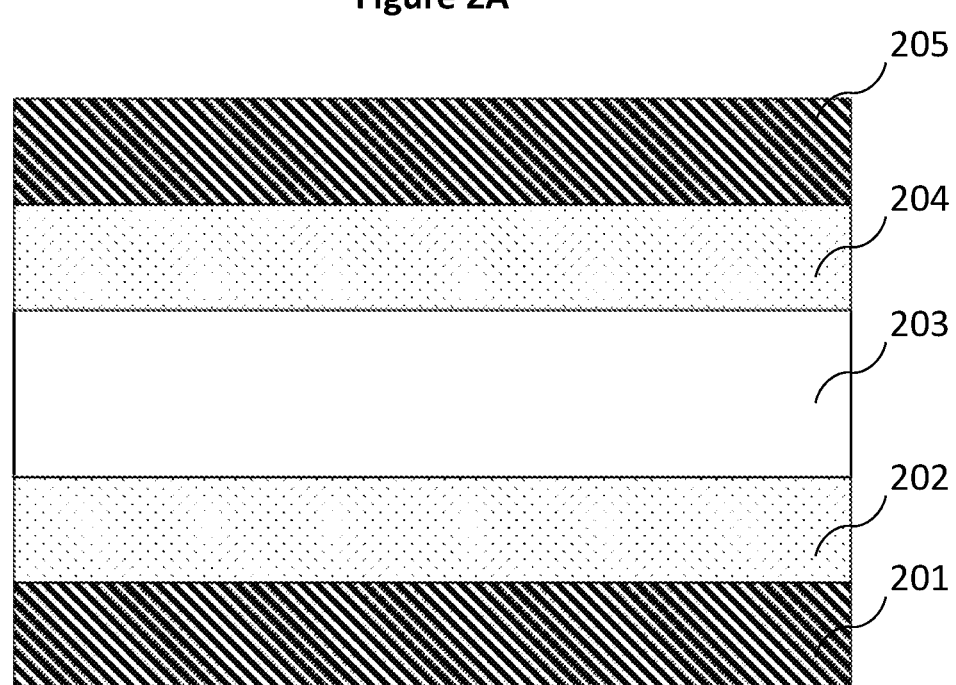
FIGS. 2A and 2B are schematic diagrams of the layers of the FIG. 1 thin film transistor sensor respectively with no stress and with mechanical stress applied.
Figure 2B:
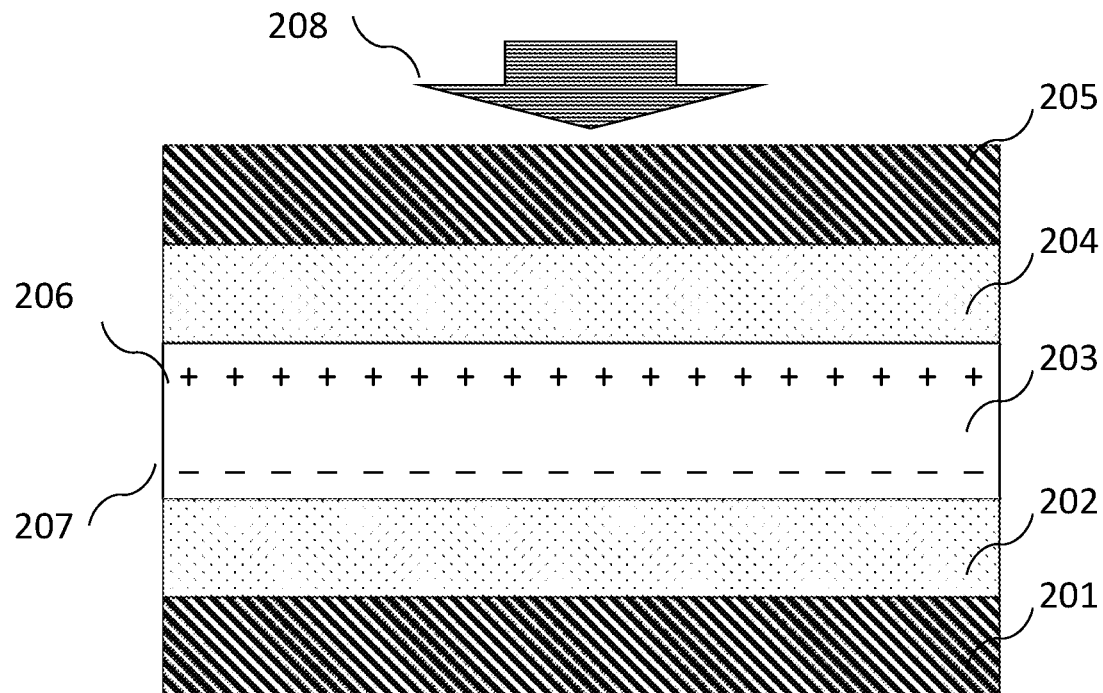

Preferred embodiment thin film transistor tactile sensor arrays incorporating the present thin film transistor tactile sensors that advance the state-of-the-art devices by providing sufficient flexibility, high spatial density, low power consumption, response speed and strong sensitivity for particularly demanding applications that include large sensor arrays, such as robotics. Experiments have demonstrated that the present sensor arrays provide such control. Present arrays integrate both sensor elements and switching elements on a flexible substrate and overcome challenges stemming from limited allowed processing steps due to thermal and chemical restrictions of flexible substrates. Present active matrix TFT arrays can achieve high spatial density, strong sensitivity and fast response by combining on/off switching for multiplexing and sensing elements into a single TFT and utilizing the piezoelectric effect.

The piezoelectric TFT in an array utilizes a piezoelectric semiconductor. The piezoelectric property of the used material transduces pressure to electronic charge. The semiconductor property of the used material permits electrostatic modulation of the conductivity in TFT device architecture such that the device can be switched on and off. Because of the transistor action which provides gain for input signals, i.e., a modulation of the gate voltage induces strong current change between the source and drain, the transistor action for piezoelectric TFT can be leveraged to amplify the response to input pressure. Any piezoelectric semiconductor material can be used. Many piezoelectric materials are electrical insulators (e.g. quartz), and hence can't be used. A suitable material should exhibit both piezoelectricity and semiconductivity. Pressure applied normal to the TFT channel induces piezoelectric charges at the surface of the TFT thereby inducing large changes in the free carrier concentration in the channel due to transistor action. As a result, a piezoelectric TFT exhibits strong current changes in response to the external pressure from its piezoelectricity. Consequently, the TFT can be used as both a multiplexing and a sensing element at the same time, which greatly reduces the fabrication complexity and steps, and therefore increases yield and reduces cost of production. It is a multiplexing element because the TFTs, aside from their piezoelectric response, can switch in state from fully on to fully off. Moreover, TFT technology is suitable for scalable processes and requires relatively low process temperatures that is compatible with flexible substrates.

Preferred embodiments of the invention will now be discussed with respect to experiments and drawings. Broader aspects of the invention will be understood by artisans in view of the general knowledge in the art and the description of the experiments that follows.

Figure 1:
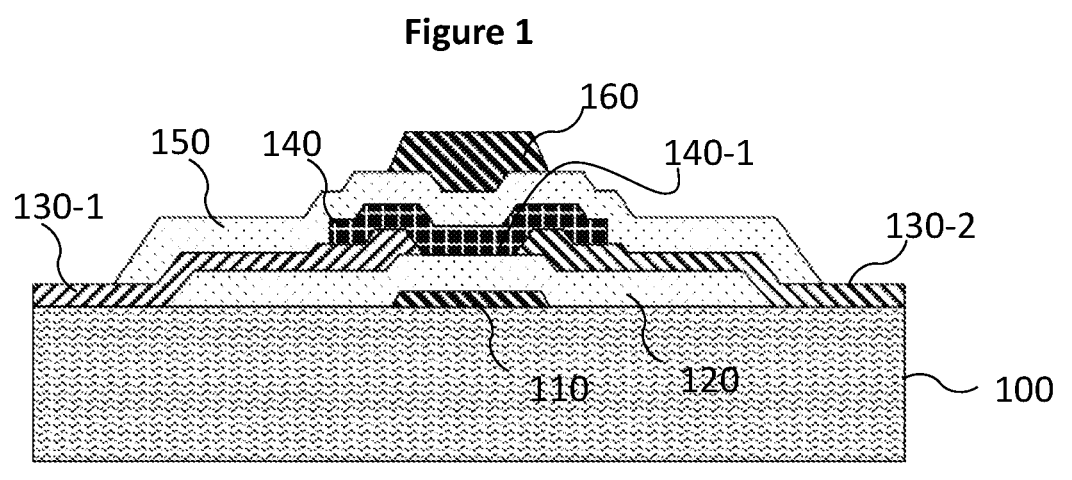

In a preferred embodiment according to the present invention shown in FIG. 1, the flexible piezoelectric TFT comprises the piezoelectric semiconductor thin film channel (channel) layer 140, e.g. ZnO (c-axis orientated), GaN (c-axis orientated), etc., whose surface that receives the pressure input is oriented in the polar c-axis crystal orientation connected with thin film source and drain metals 130-1 and 130-2, which is sandwiched between bottom and top gate thin film insulators 120 and 150, e.g. $Al_2O_3$, $SiO_2$, $HfO_2$, etc., and bottom and top gate metals 110 and 160, sitting on top of the flexible substrate 100, e.g. polyimide. The thin film source and drain metals 130-1 and 130-2 in FIG. 1 are on top of the bottom gate insulator 120 separated from each other and under the piezoelectric semiconductor thin film channel (channel) 140, leaving an opening in between ends in which is formed a central portion 140-1 of the semiconductor thin film channel upon the bottom gate insulator 120. The central portion 140-1 defines a channel between the thin film source and drain metals 130-1 and 130-2. The top and bottom gates 160 and 110 can be interconnected with other devices and control electronics and provide a charge to electrostatically control the conductivity of the thin film channel 140-1. This allows the device to be turned on and off electronically via control logic. Pressure applied to the top gate 160 or another part of the device flexes the substrate 100, which thereby mechanically stresses the channel layer 140 to generate charge that is proportional to the stress applied when the device is on. The device is formed in a mesa structure. The mesa structure is advantageous because the semiconductor and dielectric layers are inorganic materials which are vulnerable to the external stress. If semiconductors or dielectric layers are continuous all over the array, they are at risk of cracking.

The piezoelectric semiconductor thin film channel 140 can have thickness of 1-1000 nm, with a preferred thickness in the range of 10-50 nm. The distance between source metal 130-1 and drain metal 130-2 can vary from few tens of nanometers to 1 mm, with a preferred thickness in the range of 5-100 μm depending on the size of the sensor. The widths of source and drain metal can vary from few tens of nanometers to 10 mm, with a preferred thickness in the range of 10-1 mm, to achieve high W/L (width/length (distance)) ratio of 2-10. The thickness of the bottom and top gate insulator 120 and 150 can vary from 1 nm to 10 μm, with a preferred thickness in the range of 10-200 nm.

Figure 2C:
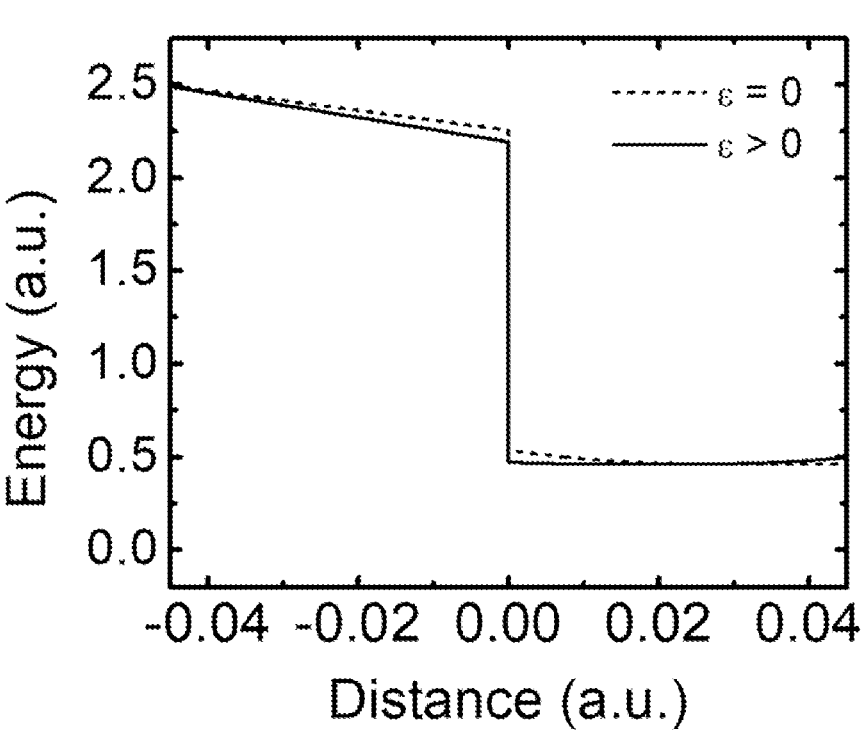
FIGS. 2C and 2D are the conduction band-edge profiles of the interface between the piezoelectric channel and its top and bottom insulator layers for a respective n-type and p-type channel.
Figure 2D:
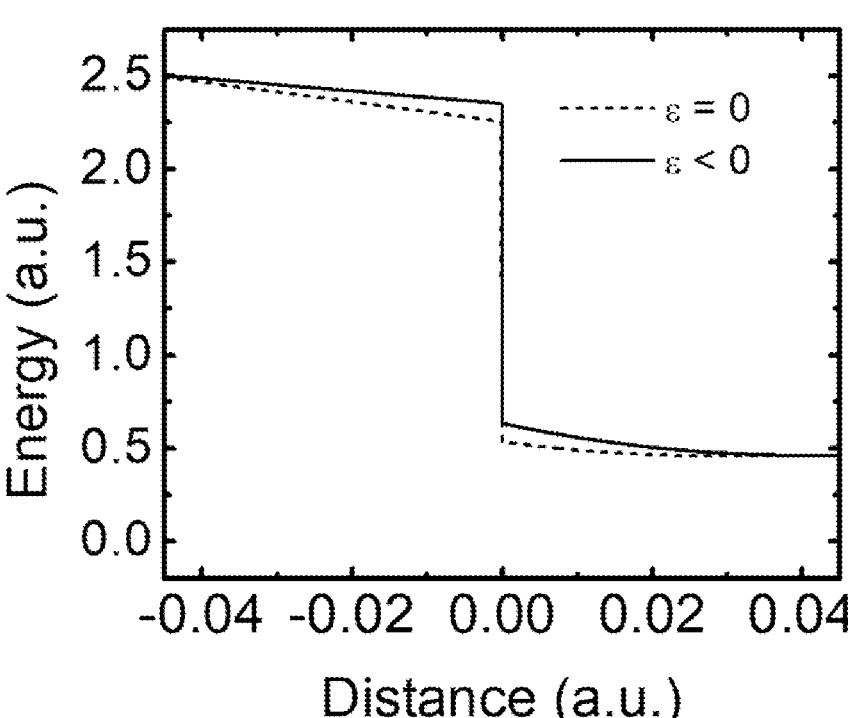

The mechanism of pressure sensing is explained. Analytic equations were utilized, for the determination of band-edge profile of the channel 203 in the presence of piezoelectric charges 206 and 207, to determine the change in the current as a function of applied stress and develop an intuitive model that captures the physics of current modulation in the present piezoelectric TFT sensor. The piezoelectric channel 203, develops piezoelectric charge at the top and bottom surface of the film, denoted by 206 and 207, respectively, when external stress 208 is being applied. These piezoelectric charges alter the band-edge profile near the interfaces between the channel 203 and gate insulators 202 and 204. In case the channel is n-type, when positive piezoelectric charges are accumulated at the interface, they attract more electrons and lower the conduction band edge, as shown in FIG. 2C. Conversely, when negative piezoelectric charges are accumulated at the interface, they repel the electrons and raise the conduction band edge, as shown in FIG. 2D. It should be noted that in thin film growth, the nucleation layers are usually highly defective and are bound by grain boundaries that can terminate piezoelectric fields. This lifts up the condition of piezoelectric charge balance at the back of the film Hence, the piezoelectric charges at the top surface are dominant to produce a net and static piezoelectric effect.

Figure 2E:
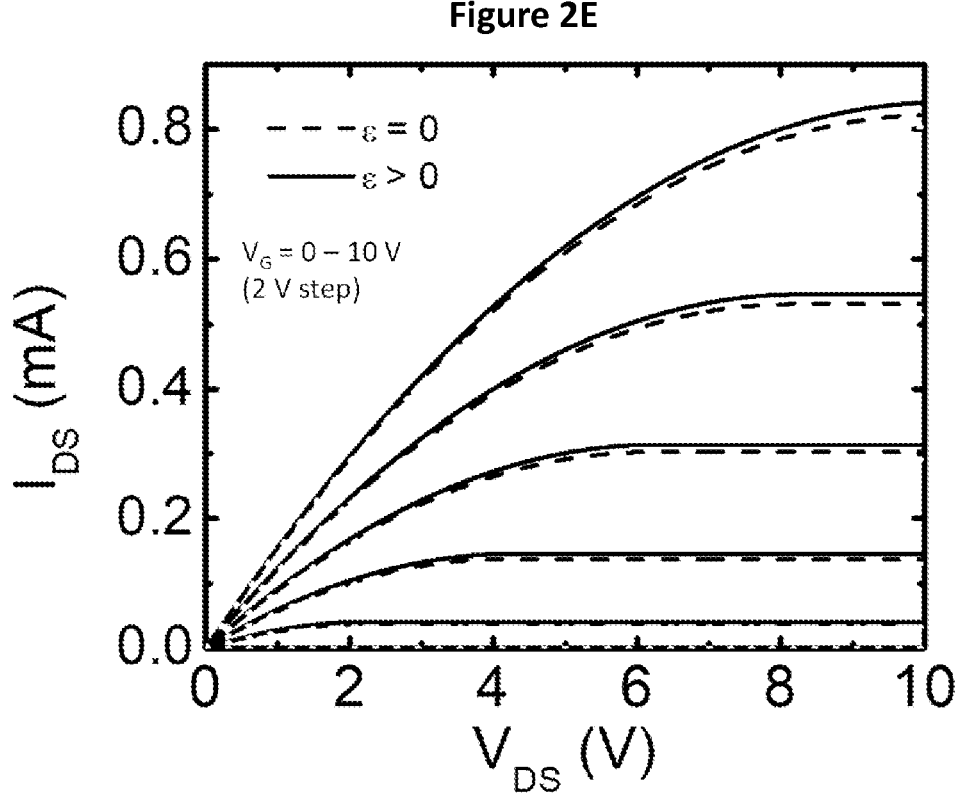
FIGS. 2E and 2F are represented analytically solved current output characteristics of the FIG. 1 thin film transistor sensor.
Figure 2F:
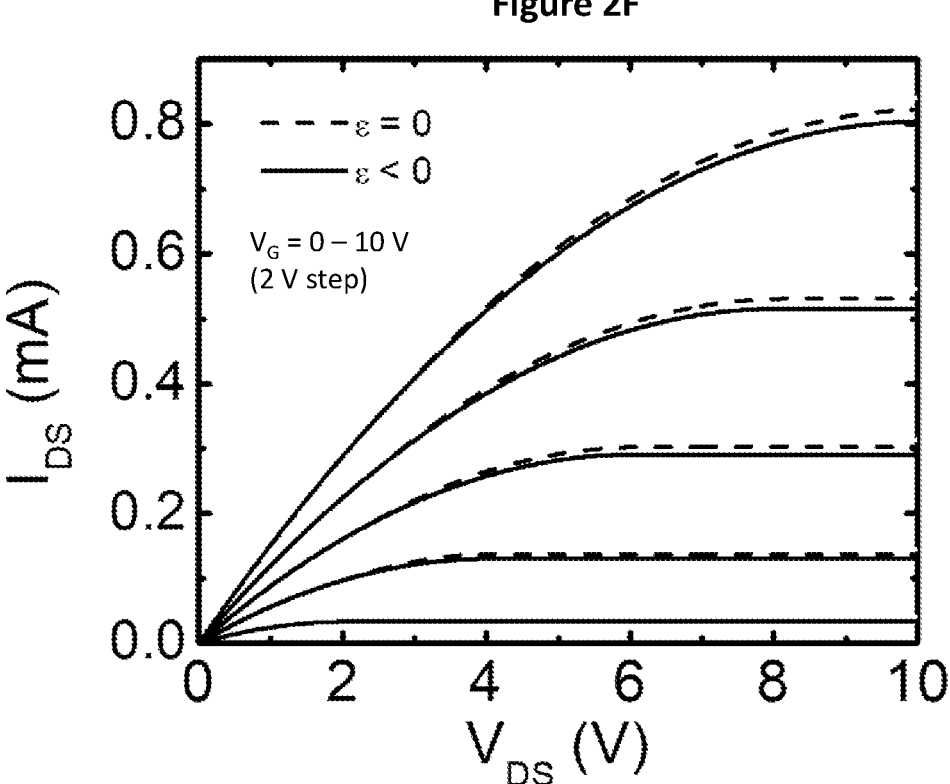

As a result, the current in the TFT is modulated by the external stress. FIGS. 2E and 2F show the output characteristics of the TFT plotted from the analytic solutions, when positive and negative piezoelectric charge is accumulated at the top surface of the channel, respectively. The sensitivity of the TFT, at saturation regime and sufficiently high gate bias (high enough to form an accumulation channel, typically 5-10 V), can be expressed as:

$$S = \frac{\frac{\Delta I_{DS}}{I_{DS}}}{\sigma_3} \approx \frac{\frac{\Delta I_S}{I_S}}{\sigma_3} = \frac{\left(2(V_G - V_{FB}) + \frac{\sigma^{PZ}}{C_i} + \frac{\sigma^{PZ}\delta_S}{2\varepsilon_S}\right)\left(\frac{\sigma^{PZ}}{C_i} + \frac{\sigma^{PZ}\delta_S}{2\varepsilon_S}\right)}{\sigma_3(V_G - V_{FB})^2} \cong$$

$$\frac{2d_{33}}{C_i(V_G - V_{FB})} + \frac{d_{33}^2\sigma^{PZ}}{C_i^2(V_G - V_{FB})^2} \cong \frac{2d_{33}}{C_i(V_G - V_{FB})}$$

Where S is the sensitivity, $I_{DS}$ is the drain current in the TFT, $\sigma_3$ is the applied stress in normal direction, $I_S$ is the current through the surface channel, $V_G$ is the gate bias, $V_{FB}$ is the flat-band voltage at the gate interface, $C_i$ is the gate capacitance, $\sigma^{PZ}$ is the induced piezoelectric charge, $\delta_S$ is the effective thickness of the piezoelectric charge, $\varepsilon_S$ is the electric permittivity of the gate dielectric layer, and $d_{33}$ is the piezoelectric coefficient of the ZnO in the c-axis direction.

Figure 3A:
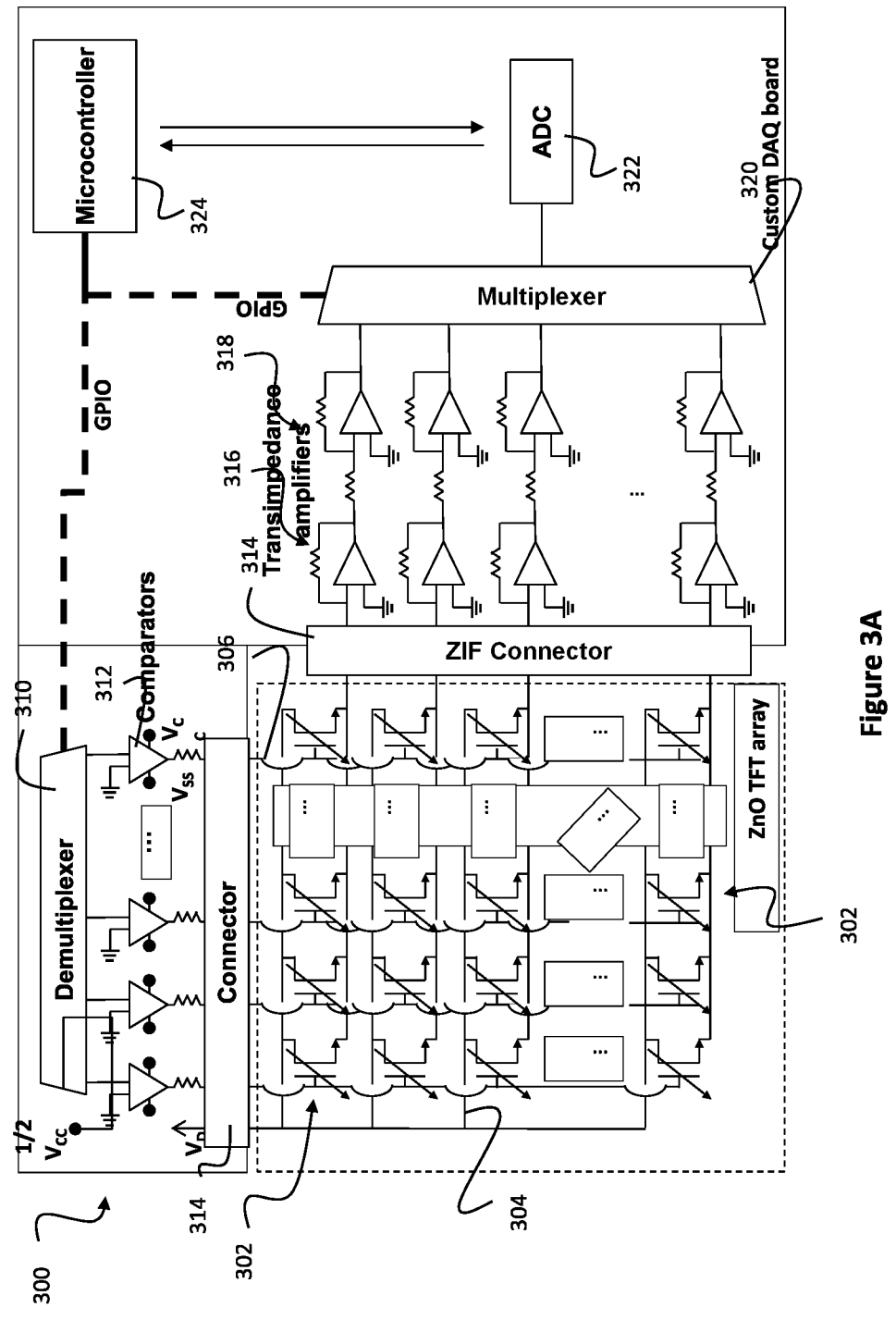
FIG. 3A is a schematic circuit diagram of a preferred active-matrix TFT sensor array of the invention with a preferred read-out circuit.

The structure of a preferred active-matrix TFT sensor array 300 is shown in FIG. 3A with a read-out circuit. The array has arbitrary dimension of m n TFT sensor devices 302 in accordance with FIG. 1. There are m source electrodes 304 spanning from the top to the bottom (or left to right depending upon orientation or arbitrary assignment of direction), and n gate electrodes 306 spanning from the left to the right. Every m TFTs 302 in a row share each source electrode 304, and every n TFTs in a column share each gate electrode 306. All the TFTs are connected to the common drain electrode, constantly powering the array.

The TFT array is driven by the transimpedance amplifier-based readout circuit also shown in FIG. 3A. In this TFT array, an arbitrary element 302 is addressed by first turning on ($V_{GS} > V_T$) the corresponding gate and grounding the rest of the gate electrodes and reading the signal from the corresponding source electrode. Specifically, an arbitrary element 302 is addressed by first turning on the corresponding one of the n gate electrodes 306 and reading the signal from the corresponding and m source electrodes 304. The gate controller is composed of a demultiplexer 310 and op-amp comparators 312 connected in the experimental device via a zero-insertion force (ZIF) connector 314. Based on the signal from the demultiplexer 310, each op-amp comparator 312 outputs either low (denoted by $V_{SS}$) or high (denoted by $V_{CC}$) voltage. In experiments, $V_{SS}$ and $V_{CC}$ were selected to be ground and 5 V, respectively, but can be changed depending on the characteristics of the TFT or demands of a particular application and available power supply. The current at each source electrode is amplified by the first transimpedance amplifier 316 with a gain of 100-10M. Additional transimpedance of negative unity gain 318 is followed in series to achieve the net positive gain and better signal isolation. The amplified signal is multiplexed 320, and two additional buffering stages are followed to add additional gain (none/10 k/adjustable) and/or high-pass filtering option. Finally, the signal is digitized by 16-bit analog-digital converter (ADC) 322. Data is collected by a microcontroller 324 that also controls read-out operations of the read-out circuit. The microcontroller 324 can be interfaced to a computer for data analysis, generation of heat maps, data storage etc. If there are any defective elements 302 from which a reading can't be made, the data of the defective cell can be replaced by taking average values of good neighboring elements, which is called a convolution operation.

Figure 3B:
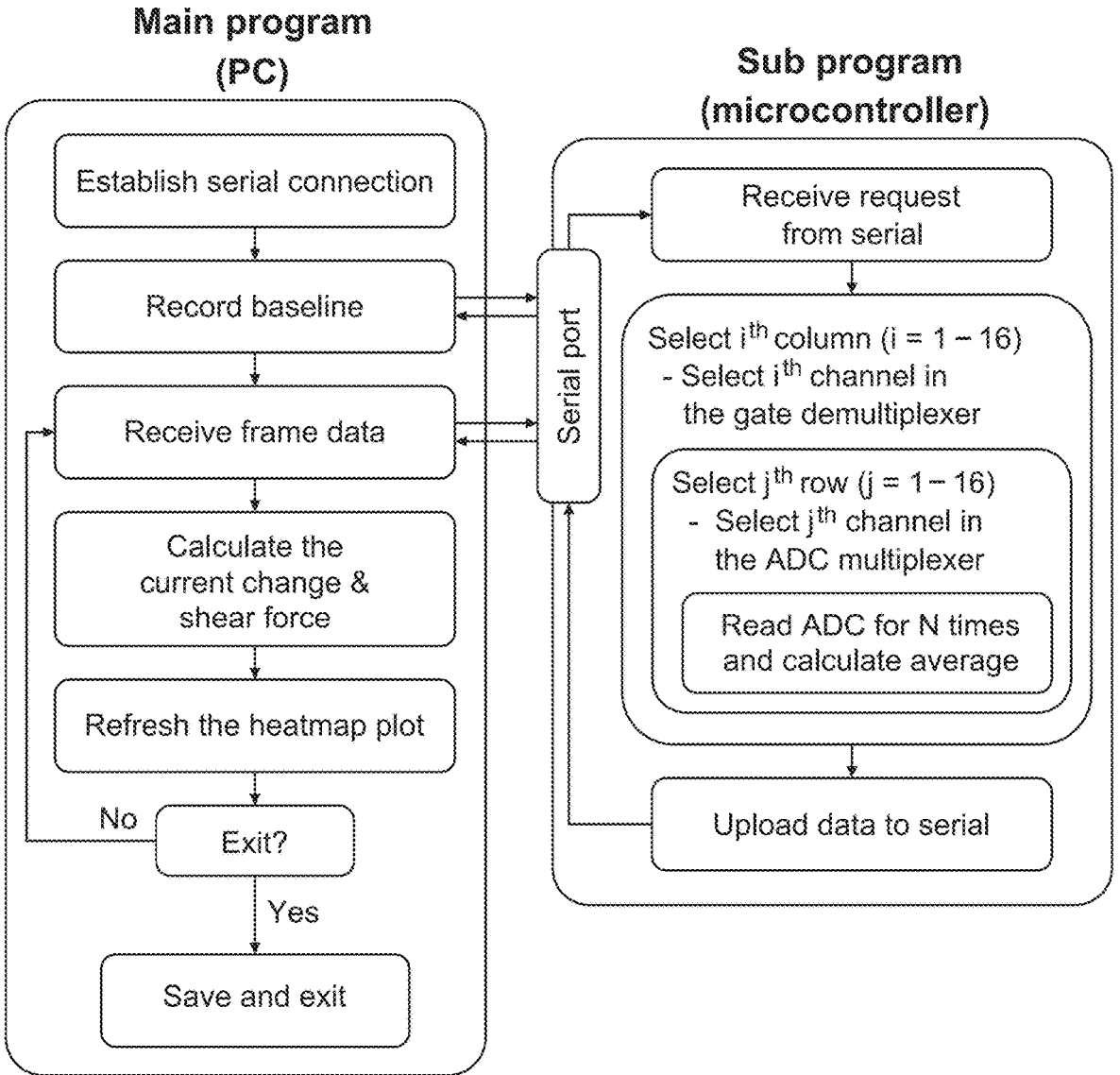
FIG. 3B is a block diagram of the microcontroller operation of the FIG. 3A read-out circuit interfaced with a computer for data acquisition, analysis and storage.

Preferred control and interaction between the microcontroller 324 and a computer follows the steps in FIG. 3B. The two programs communicate using a serial port. Once the connection is established, the main program initiates a sub program to record the baseline current of the sensor array. When the sub program receives the request, it turns on the first column (first gate electrode) and selects the current from the first row (first source electrode). Then it reads the current value from ADC 322 for N (number of oversampling) times and calculates the average. Here N is set prior to running the program. Once the read and average calculation is done, it selects the next row and does the same process. When it scans over all m rows, $2^{nd}$ column is turned on data is collected from the m rows again. After all the data from n columns is collected, it is sent back to the main program in PC. The main program receives this data of one frame and sets this as a baseline current. After reading the baseline current, the main program performs the following loop: First the program requests the data to the sub program. The sub program performs the same process described above and send back the frame data. The main program calculates the change of the current and shear force values based on the received frame data. Once the calculation is done, it plots (refresh) the data in heatmap plots, and requests new frame data to the sub program. This loop is processed until the user asks for an exit of the program. When exit command is prompted, the main program saves all the data collected so far to the text file for further process in the future.

In more detail, when there is an external pressure, electrons are accumulated in the channel due to the piezoelectric effect of each TFT device 302. The current of the transistor is a function of both gate bias as well as external pressure. At each recording, the readout circuit applies high voltage to the selected one gate electrode 306 while for the rest of the gate electrodes 306 bias are kept low. The current at each source electrode 304 is amplified by a transimpedance amplifier 316 with a pre-set specific gain, for example in a range from 100 to 10 M. To maintain the polarity of the signal, another transimpedance of negative unity 318 gain can be followed to achieve the positive net gain. The amplified signal is multiplexed 320 and digitized by the 16-bit analog-digital converter (ADC) 322. The operation of the readout circuit can be controlled by the microcontroller 324 which communicates with the personal computer (PC) or other computing device. In the example of the 16-bit ADC 322, a single ADC converts a voltage signal to 16-bit digital numbers (while the number of bit may vary depending on the type of ADC) To read over the entire array, rows and columns are scanned each element is read one-by-one. Multiple ADCs can be used to save time that is required to read the entire array.

Shear force sensing can be added to the FIG. 1 TFT sensor and the array of FIG. 3A, with the structure shown in FIGS. 4A-4C. The FIG. 1 TFT is primarily sensitive to the normal force, but the FIGS. 4A-4C 3D structure can convert shear force into normal force for the FIG. 1 TFT. See, H. K. Lee, J. Chung, S. Il Chang, and E. Yoon, "Normal and shear force measurement using a flexible polymer tactile sensor with embedded multiple capacitors," *J. Microelectromechanical Syst.*, 2008. In FIGS. 4A and 4D, a tall polymer pillar 420 is located at the center with a larger base that covers four TFT sensors of FIG. 1, two of the sensors are shown in the cross-sectional view of FIG. 4, sensors 410 and 411 on top of the flexible substrate, 400. When a normal force is applied, all four sensors are equally stressed, as illustrated in FIG. 4A. However, when shear force is applied, a torque is induced to the pillar and deforms the structure around the cell and consequently applies compressive force to the two sensors and tensile force to the other two, as shown in FIG. 4B. By calculating the amounts and differences of applied force measured by each TFT inside the unit, the normal and shear force components can be extracted. The net shear force can be calculated from the response of each sensor in the cell based on the formula in FIG. 4C. Here, $u_{ij}$ represents position vector for each sensor, and represents the force values measured by each sensor. To calculate the shear force, which is a vector, the difference of local sensor force from that of the average force can be calculated. This difference is then multiplied by the position vectors $u_{ij}$ for each sensor, i.e. calculation of weighted position vectors, followed by taking average of the four weighted position vectors.

Fabrication of the millimeter scale pillar array was done by casting PDMS using a 3D-printed mold. First, a 3D model of mold was designed and printed using a 3D printer with printing material of Acrylonitrile Butadiene Styrene (ABS). PDMS precursor and curing agents were mixed with weight ratio of 10:1 (for example, 15 g of precursor and 1.5 g of the curing agent), then poured onto the mold. It went through 1 hour of degassing in vacuum desiccator and more than 24 hours of room-temperature curing. When curing was done, the cured PDMS pillar array was mechanically released. The released PDMS was transferred onto the sensor array. An L-shape tip was designed to characterize the shear force sensitivity of each unit. Here, the bottom part of the tip has width of 1.5 mm which is narrower than the upper part (4 mm) This allowed us to avoid interference with other pillars with pitch of 2 mm of the experimental TFT array.

We have demonstrated the feasibility of manufacturing methods of flexible piezoelectric TFT arrays for real-time recording of normal and shear forces with high spatiotemporal resolution. 16×16 active matrix force sensor array with a pitch of 100 μm to 500 μm were fabricated. FIG. 5A shows one of the devices with a pitch of 250 μm. Here each row (drain) and column (gate) correspond to the data line and address line of the active matrix display counterpart. The fabricated TFTs exhibited high $I_{max}/I_{min}$ ratio of $10^6$-$10^7$ as shown in FIG. 5B with negligible gate leakage current (few pA), indicating excellent electrostatic control over the channels. FIG. 5C shows the output curves of the ZnO TFTs showing linear characteristics at low $V_{DS}$ and excellent pinch-off characteristics in saturation at high $V_{DS}$, which important for linear operation and force responsivity.

The performance of normal and shear force sensing has been tested. FIG. 6A shows the force response of 9 randomly selected spots that exhibit monotonic increase as a function of applied force with a slightly reduced sensitivity in the higher force range. The sensitivity and linearity error of the TFT array for the force range of 0-150 mN was calculated to be 0.207(±0.0172) %/mN and 7.07%, respectively. Here, sensitivity was given by the slope of the terminal line, and the linearity error was given by the maximum deviation of the current change as a fraction of full scale: $\Delta y_{max}/y_{max}$ where $\Delta y_{max}$ is the maximum deviation of the current change from the terminal line and $y_{max}$ is the maximum current change at the highest force in the given range. The spatial resolution of the TFT array was investigated by a two-point discrimination study utilizing 3D stamp with extruded pillars. Using the 100 μm pitch device, the array resolved two points with spacing of 500 μm, as shown in FIG. 6B. Finer resolution was demonstrated by placement and pressing of a hair on top of the sensor array by a glass slide. The diameter of the hair is known to be ranging around 80 μm. FIG. 6C shows the photo of the hair on the sensor array and corresponding response heatmaps. Linear patterns with dual line appeared at the same location and direction of the hair placement.

The response speed is characterized with a moving tip where the z-height over time follows the 2.5 Hz square wave with rise and fall time of 10 ms. The average response of the sensors of interest are scatter plotted in FIG. 6D, along with the z-position over the time in the same graph (blue curve). The full peak was developed immediately upon the applied force and rapidly returned to the baseline, clearly showing the ability of real-time tracking of the applied force with a response time that is dominated by that of the measurement apparatus.

Figures 6E, 6F, 6G, 6H:
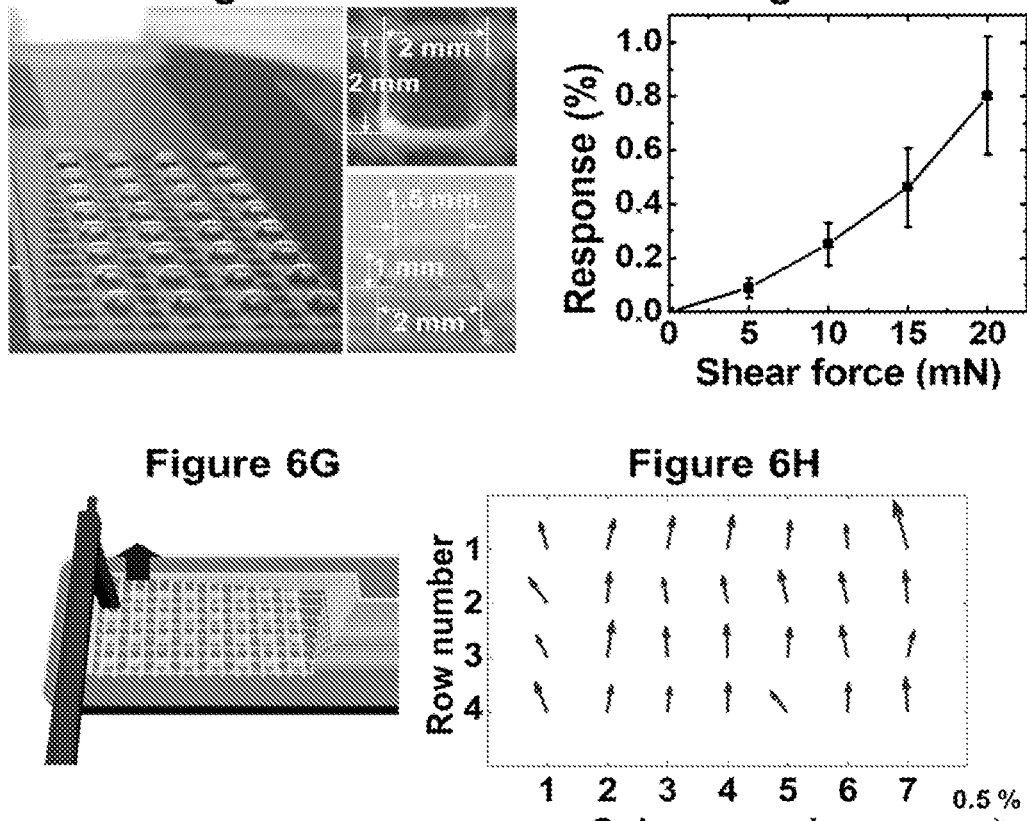
FIG. 6E shows shear force response for 6 randomly selected elements in the array.
FIG. 6F shear response along x-axis.
FIG. 6G shows illustrates the shear testing method.
FIG. 6H shows Quiver plots for the shear testing.

To measure the shear force, PDMS pillars were employed with base width of 2 mm with corners centered at each ZnO TFT sensor, a height of 1 mm and overall at least 25% smaller width at the top surface were used to convert lateral to shear force, depicted in FIG. 6D. The shear force response for 6 randomly selected elements in the array is shown in FIG. 6E. The relative increase of current amplitude for shear force increased faster than the linear force, presumably due to PDMS pillar deformation and stress redistribution which are non-linear processes. Nevertheless, shear response along x-axis (FIG. 6F) were fairly uniform from the Quiver plots shown in FIG. 6H, with shear force applied according the scheme in FIG. 6G.

The device was fully operational as intended under highly bent conditions. A 500-mm-pitch 16×8 TFT array was rolled over a plastic rod with a bending radius of 5 mm We tested normal and shear sensing of the bent device by pressing the array with wooden stick or sliding a transparent rod on the array. Locations of the applied normal force were well captured as, and locations and directions of applied shear forces were also well resolved. The reliable operation under highly bent conditions is attributed to the isolation of oxide materials for each TFT (ZnO channel, ITO contact and $Al_2O_3$ dielectric layer) where these layers are patterned in mesa structures. Accordingly, the strain applied to the oxide materials can be minimized under bending condition and more strain could be distributed to the polymer substrates. The mesa structure should be large enough to contain source/drain electrodes and gate electrodes without compromising mechanical stability, but small enough to minimize the strain under bending. While relative dimensions can vary depending upon the specific materials and designs, for the experimental examples a reasonable choice is to make the length and width of the mesa structure at least 20% larger than the respective channel length and width.

The shear force is proportional to the difference between the forces that appear on the two sensors, $F_1$ and $F_2$. The position vectors of $F_1$ and $F_2$ have the same length but opposite signs. Given this, the shear force can be expressed as follows:

$$\vec{F}_{shear}=C\times(F_1\cdot\vec{u}_1+F_2\cdot\vec{u}_2)$$

Calculation of shear in our case relies on measuring currents from four sensors. Two-dimensional analysis is necessary. The shear force is the linear combination of the two orthogonal (diagonal) components. Each component can be calculated in analogy to the 1-D case, as follows:

$$\vec{F}_{shear,x}=C\times(F_{11}\cdot\vec{u}_{11}+F_{22}\cdot\vec{u}_{22})$$

$$\vec{F}_{shear,y}=C\times(F_{12}\vec{u}_{12}+F_{21}\cdot\vec{u}_{21})$$

The net shear force can therefore be expressed as:

$$\vec{F}_{shear}=C\times(F_{12}\cdot\vec{u}_{12}+F_{21}\cdot\vec{u}_{21}+F_{12}\cdot\vec{u}_{12}+F_{21}\cdot\vec{u}_{21})\propto\Sigma(F_{ij}\cdot\vec{u}_{ij})$$

The stability of the device under repeated bending cycles was investigated using automated bending cycle tests. Here, the device was folded and released by the linear actuator which pushes back and forth on one side of the TFT array with the other side fixed. This motion repeatedly changed the bending radii from 2 to 7 mm Intermediate evaluation of the response of the array was examined by applying a force of 25-50 mN using the 2-mm-sized acrylic tip and measuring the responses, before the bending cycle test and after 1000, 2000, 5000 and 10000 bending cycles. The performance of the TFT array did not degrade due to bending. The average current change of TFTs pressed by the tip, before and after 1000, 2000, 5000 and 10000 bending cycles were consistent for force values of 30, 40 and 50 mN, demonstrating stability of the device sensitivity regardless of the number of bending cycles.

Experimental tactile sensors were also used for real-time recording of multi-touch and slide input. Single and repeated multi-touch inputs did not show any difference in response time, sensitivity, or other properties. Shear force was also successfully sensed and visualized in real time with sliding a finger as above the array Quiver plots indicated direction of the moving finger, successfully capturing the multi-dimensional information of the touch input.

Figure 7A:
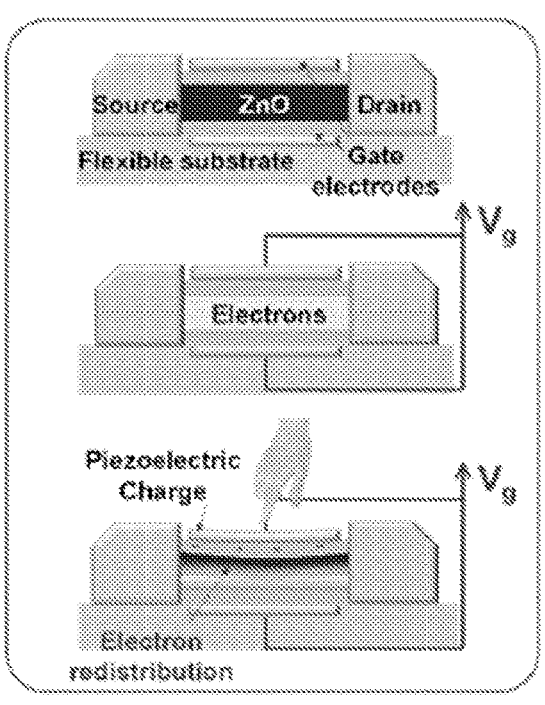
FIGS. 7A and 7B show an additional experimental TFT array sensor device of the invention in perspective and exploded perspective views.
Figure 7B:
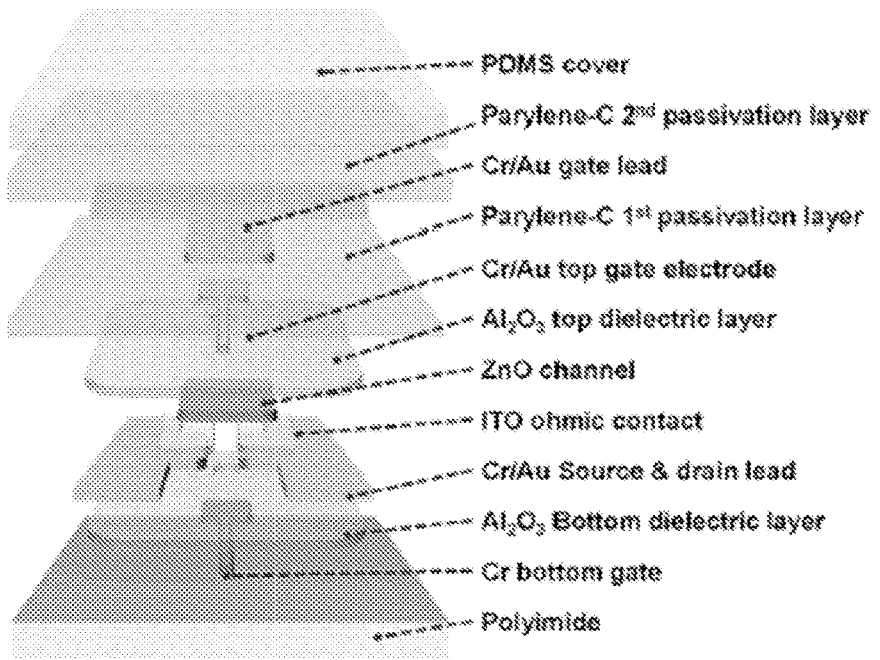
Figures 8A, 8B, 8C, 8D, 8E, 8F, 8G:
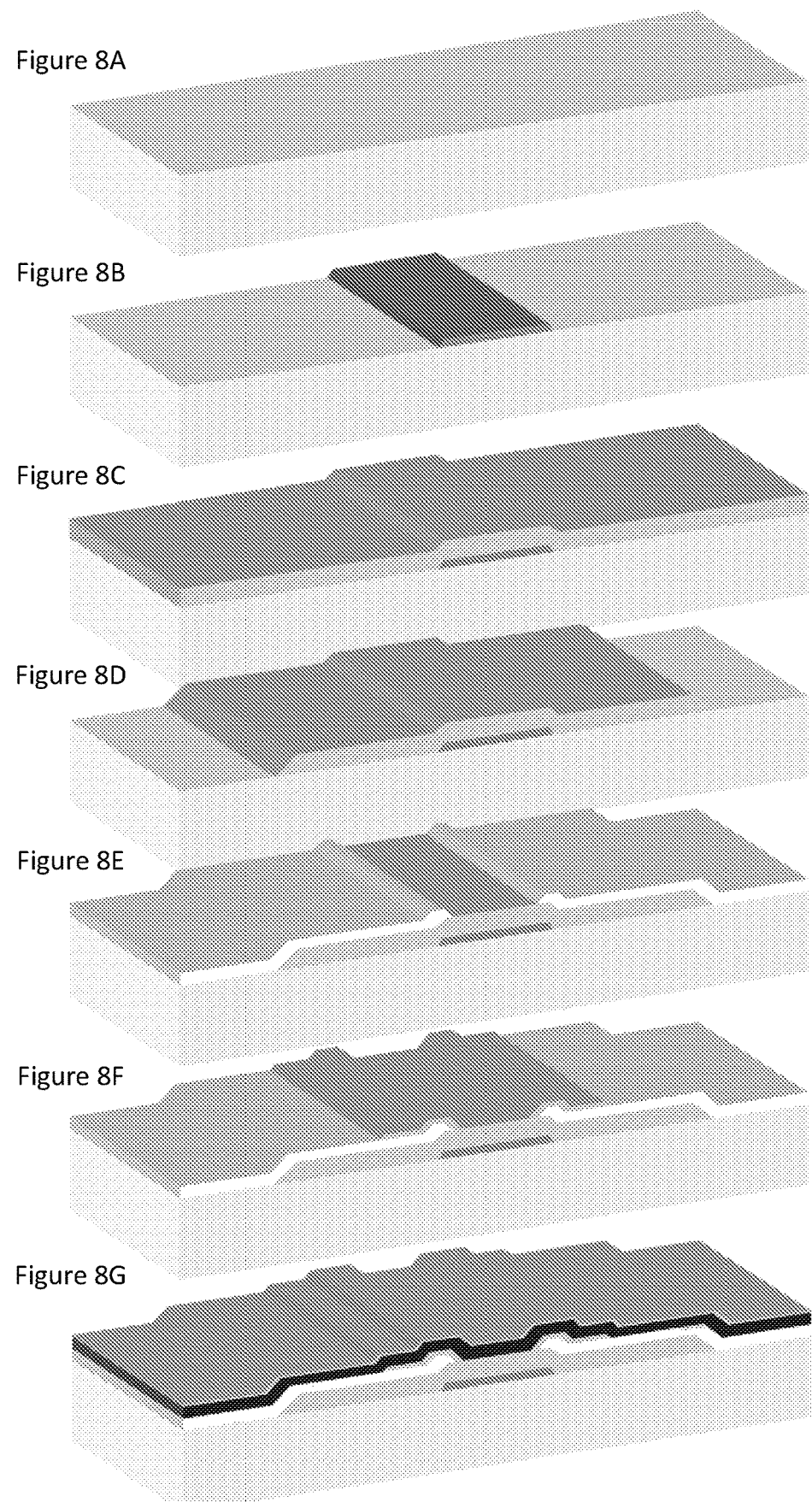
FIGS. 8A-8P illustrate steps in a process used to fabricate the FIGS. 7A and 7B TFT array sensor device.
Figures 8H, 8I, 8J, 8K, 8L:
Figures 8M, 8N, 8O, 8P:
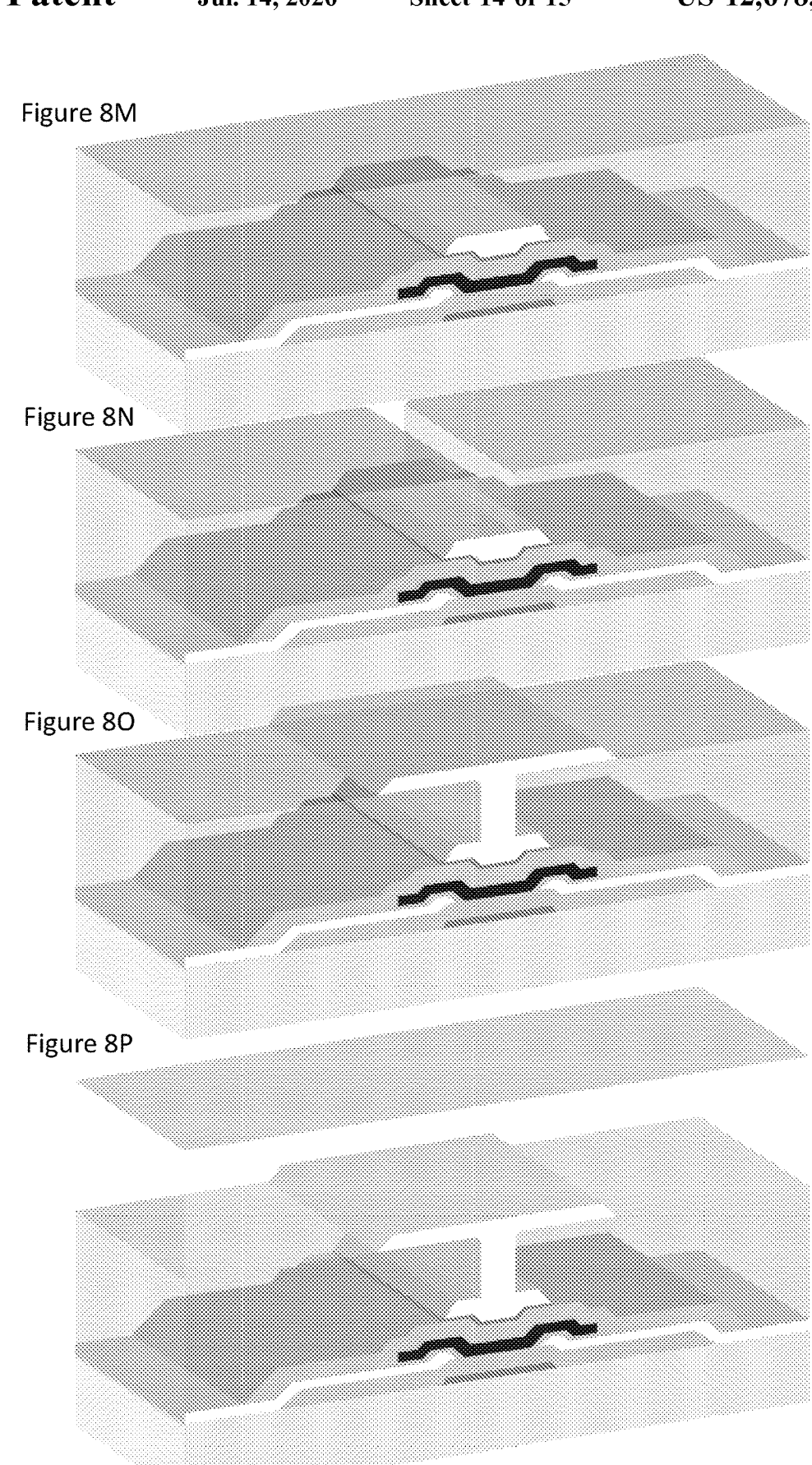

FIGS. 7A and 7B show an schematic illustration of the TFT array sensor device of the invention. The fabrication process for the device is shown in FIGS. 8A-8P. For the preparation of polyimide film (FIG. 8A), PI-2610 (DuPont) was spun-coated and soft-baked on single-side polished Si wafer (University Wafer), followed by thermal curing process in a nitrogen purge oven. This spin-coating, soft-bake and curing processes were repeated twice to achieve a thicker film Spin-coating was done at 2000 rpm for 2 min, and a soft bake started at 40° C. for 20 min for slow evaporation of the solvent from the film. The temperature of the hot plate was increased to 90° C., by repetition of the following two steps: raising the temperature by 10° C. and resting for 3 min. At 90° C., the temperature again increased to 150° C. and the sample was cured for 3 min at 150° C. After soft baking, the sample was placed inside the nitrogen purge oven. In the thermal curing process, the temperature was raised to the desired temperature at the rate of 3° C./min, then curing temperatures and times were 300° C./60 min for the $1^{st}$ PI layer, and 350° C./30 min for $2^{nd}$ PI layer, respectively.

For the formation of bottom gate electrodes as in FIG. 8B, Cr/Au (20/60 nm) metal layers were deposited by DC sputtering. Photoresist (AZ-1518) etch mask layer was patterned using mask aligner (Karl Suss MA6 mask aligner), then metal layers at unwanted area were removed by wet etch of Au (Transane Au etchant) and Cr (1020 Cr etch). The photoresist was removed in a heated remover PG solution (80° C.) for more than 1 hr. For devices which do not have bottom gate, this process was omitted. After formation of bottom gate, as a bottom gate dielectric and growth buffer layer, 50 nm of $Al_2O_3$ layer was deposited in FIG. 8C by ALD (Beneq ALD system) at 200° C. TMA and $H_2O$ were used as the precursors of aluminum and oxygen, respectively. Prior to the ALD of $Al_2O_3$, only TMA pulses were introduced to the chamber to improve the interface property. Portions of the bottom gate dielectric were etched to form the pattern shown in FIG. 8D. Metal leads (Cr/Au) for source and drain electrodes were deposited and patterned in FIG. 8F, using the same process used for bottom gate electrodes. For Ohmic interface, 70 nm of ITO layer was deposited in FIG. 8G by RF-magnetron sputtering, followed by patterning and wet etching using dilute HCl solution. After patterning, ITO was annealed in a Rapid Thermal Annealing (RTA) system at 250° C. for 3 min in $N_2$ ambient, to improve its conductivity. ZnO channel layer was deposited in FIG. 8G using RF-magnetron sputtering at 200° C. At the initial 4 mins, only Ar was used as an ambient gas, followed by 31 mins of deposition under mixture of Ar/$O_2$ gases. The ratio of $O_2$ to the Ar was controlled to be 5-20% while the chamber pressure was kept constant at 2 mT, depending on the desired device performance. After deposition the sample was cooled down to room temperature in the chamber. The ZnO film was passivated by 10 nm of $Al_2O_3$ film deposited by ALD, immediately after taking out the sample from the sputtering system. The $Al_2O_3$/ZnO film was mesa etched in FIG. 8H using dilute buffered oxide etchant (100 mL of BOE and 300 mL of deionized water) solution. After mesa etch, additional 40 nm of $Al_2O_3$ layer was deposited in FIG. 8I by ALD as a top dielectric layer. To expose the buried bottom gate electrode, additional wet etching of $Al_2O_3$ was carried out using BOE in FIG. 8J. Top gate electrodes of Cr/Au metal stack were formed in FIG. 8K using the same process for source/drain metal leads and bottom gate electrodes. Source and drain contacts were exposed in FIG. 8L. As an isolation and passivation layer, 4 g of parylene-C (corresponding thickness~2 μm) was conformally coated on the device in FIG. 8M, and via holes were etched by $O_2$ plasma dry etch process in FIG. 8N. Gate leads were formed in FIG. 8O by the same process to those for other Cr/Au metal electrodes. To address individual TFTs in the array, flexible flat cable (FFC) was bonded in FIG. 8P to the device via anisotropic conductive film (ACF) tape using heat press machine. Experimental devices were also protected with different thicknesses of PDMS protection layer, which can also serve as the flexible device substrate. A thicker protection layer distributes more force across itself, reducing the spatial resolution (but stronger protection). There is a trade-off, therefore between protection and spatial resolution and requirements for particular applications can balance this tradeoff. As an example, a protection PDMS sheet of around 70-100 μm provided protection while its affect on the spatial resolution was minimal.

To demonstrate the utility of real-time spatial information of applied force, we demonstrated a closed-loop control of robotic gripper where each finger was equipped with a tactile sensor array of the invention. The gripper safely holds fragile or heavy objects without human intervention in the gripping process using feedback from the tactile array. When a raw egg was placed at the center of range of the gripper with mounted TFT arrays and a grip command was issued, each finger approached to the egg until a certain force is recorded from the TFT array. If the average normal force of the TFT array become stronger than the previously set value, the fingers stopped the movement. Once the gripper becomes stationary, the supporting floor for the raw egg was moved down to simulate the lift-up scenario. The egg was stably held by the gripper for more than 10 sec, and no damage was observed on the egg after multiple grip processes.

Figure 9:
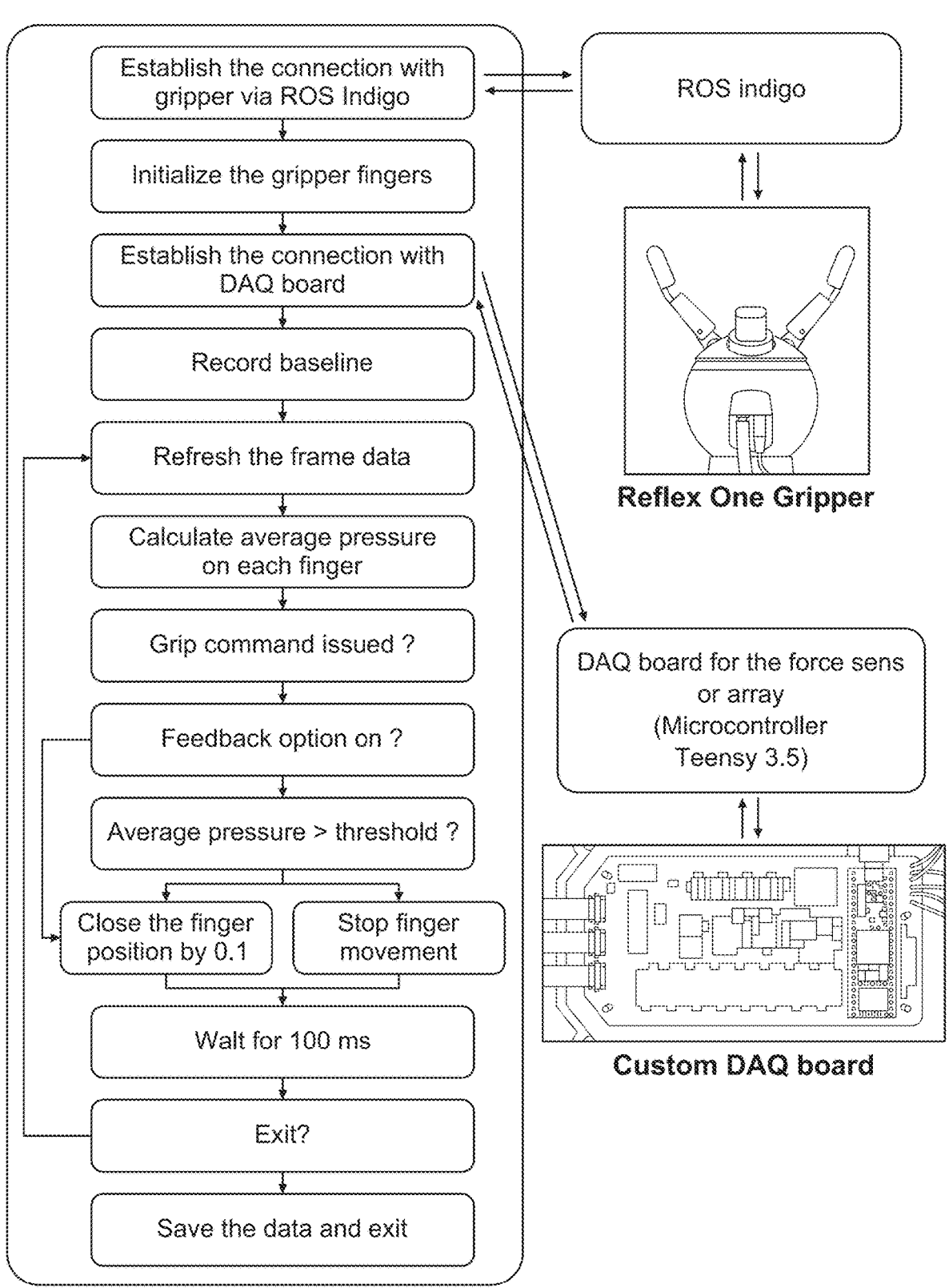
FIG. 9 illustrates a preferred real-time robotic gripper with the control method used with TFT array sensor devices of the invention applied to each gripper arm.

Shear force sensing can be used to detect object slipping at grip interfaces and can be further utilized in the closed-loop algorithm to implement a system with self-adjusting grip force. FIG. 9 shows a gripper and control used for testing real-time gripping with the TFT sensor arrays. The control program recorded the pressure information from TFT arrays and simultaneously controlled the motion of the gripper, to achieve a closed-loop control system. A PC was configured with Ubuntu 14.04 operating system, and the gripper was mainly controlled by the Robot Operating System (ROS, version indigo) which is freely accessible and widely used in robotics R&D. The integrated control software was programmed by python and communicated with both ROS and the microcontroller in the DAQ board, to perform simultaneous control of both systems. When the program was started, the software established the connection with ROS system, and initialized the position values of each finger of the gripper. Connection with the DAQ board was followed. When both connections were established and baseline current was read from the DAQ board, the system was ready to perform a grip motion.

The program will then be in the loop of adjusting the position of fingers in the gripper and reading the force data, which is performed in frequently enough for real-time control, e.g. every 100 ms. Fingers were stationary until the grip command was issued. Once it was issued, the program evaluated whether the average normal force applied to the sensor array was larger than the preset threshold values. While the average force was smaller than the threshold, the finger position kept increasing by 0.02 units (1.5 units$\approx$90° rotation of the fingers) at every loop, which closed the fingers. Once the finger grasped an object and the average force became higher than the threshold in a certain loop, the fingers stopped moving and initiated the grip command. When the program is prompted to exit, it saves all the force data and gripper position data of each loop, for further processing.

When a gripper is trying to grasp a relatively heavy and slippery object such as a baseball, normal grip cannot sense slip and as a result, the object will slide on top of the sensor array. The gripper was tested holding a baseball from multiple incidents, indicating the sliding object due to the insufficient grip force. The sliding action generated a constant downward shear force to the sensor in combination with 3D pillar array. When the measured shear force values were fed into the feedback loop, the gripper automatically adjusted the force, without any visual or human assistance, to achieve secure grip. To implement this, a normalized threshold force value was included in the closed-loop control system and is calculated based on the normalized net shear force of the sensor array. Once shear-feedback is turned on, this threshold is calculated at every data acquisition point with the formula, Threshold=a+b×net shear force, and compared with the net normal force, where a and b are constants that were determined experimentally in the baseball grip experiment. If the normal force does not exceed the threshold force, the gripper fingers apply a larger grip force. With threshold value being refreshed in real time, this process repeats until the normal force exceeds the threshold force value. When grip command is issued, the gripper increases angle (i.e. closes the fingers) to approach and hold the object. Once the net normal force exceeds the pre-programed threshold force, the gripper does not increment the normal force anymore (does not adjust the gripper angle) and a stable grip is achieved.

The superior spatiotemporal resolution, strong sensitivity, and reliable operation under bending conditions of these flexible TFT arrays substantiate their potential for future applications in healthcare, biomedical devices, or robotics. A 250-μm-pitch TFT array was tested for blood pulse sensation. The array was attached on the adult wrist where the radial artery is located. To capture the weak mechanical signal from the radial artery, a digital bandpass filter with a passband frequency range of 0.5-20 Hz was applied after the recording, to eliminate the slow shift in the baseline and high-frequency noises. The temporal response of the TFT with the strongest response exhibited the typical pattern of the blood pressure of a human adult. The averaged response was obtained by averaging 23 pulses of the temporal response curve. Thanks to strong sensitivity and high temporal resolution (acquisition frame rate of 100 Hz) of the TFT array, the averaged response clearly resolved different features of pulse signals such as systolic pressure (p1), late systolic pressure (p2) and early diastolic blood pressure (p3).

Water-proof operation is important for a variety of applications including those in biomedical devices. We tested the operation of the TFT array with pitch of 500 μm being submerged in the saline solution after encapsulating the device with a 2 μm thin parylene-C layer. The array was submerged in a saline solution. The array was able to resolve saline flow-direction toward one of its edges without any physical contact with the array. The array detected that the pressure from the water flow peaked for very short period, smaller than 80 ms, then dissipated quickly. Recorded data distribution of the shear forces on the array correctly indicated that the water flow was directed towards the top right corner.

The transistor and piezoelectric properties of ZnO TFTs on glass substrates can be tailored and optimized by the $O_2$/Ar gas flow rate ratio during deposition. This is primarily accomplished by manipulating the number of oxygen vacancies in the film which when passivated with hydrogen essentially act as donors for n-type semiconductive film property. On flexible substrates, we fabricated ZnO TFTs for different $O_2$ gas flow percentage simultaneously and that otherwise underwent the same fabrication steps. The TFTs were fabricated with varying $O_2$ flow percentage of 20, 10 and 5% in an $O_2$/Ar gas mixture. For all cases, fabricated TFTs exhibited high $I_{max}/I_{min}$ ratio of $10^6$-$10^7$ with negligible gate leakage current (few pA), indicating excellent electrostatic control over the channels. On the other hand, threshold voltage ($V_{th}$) was shifted toward negative values as the oxygen ratio decreased, resulting in higher $I_{max}$ values.

TABLE 1

DC characteristics of the ZnO TFTs fabricated
with different $O_2$ flowrate.

| Parameters | $O_2$/<br>Ar = 20% | $O_2$/<br>Ar = 10% | $O_2$/<br>Ar = 5% |
|---|---|---|---|
| Threshold voltage $V_{th}$ (V) | 5.9 | 2.2 | −0.1 |
| Subthreshold slope (mV/dec) | 920 | 490 | 720 |
| Field-effect mobility $\mu_{lin}$ (cm²/Vs) | 1.57 | 8.47 | 8.79 |

ZnO TFTs with 10% $O_2$/Ar provided superior subthreshold slope which leads to smaller operational voltage range and due to their lower threshold voltage in the normally-off state compared to 20%, that is desired for low power biasing.

The specific contact resistance of the interface ranged from 0.05-0.15 Ωcm² for the film with 5% $O_2$, and 0.01-0.05 Ωcm² for the case of 10% $O_2$. It is worth noting that the inverse subthreshold slope initially decreases with 10% $O_2$, when compared to 20% $O_2$ and then increases at 5% $O_2$.

By virtue of the scalable nature of the fabrication process of FIG. 8, we were able to be further scale down the force sensor to a 100 μm spatial resolution. 16×16 TFT arrays with different pitches of 500, 250 and 100 μm were fabricated. The area coverage for each array were 8×8, 4×4 and 1.6×1.6 mm², respectively. The devices were released from the original Si substrates and laminated with thin PDMS sheets. The corresponding TFT channel dimensions in each array were (width/length) 200/20, 100/10 and 40/4 μm demonstrating ease of scaling to sub-5 μm channel lengths. Two data peaks originated from the extruded pillars were clearly distinguishable showing that the array delineates the difference of objects spaced by 500 μm using the TFT array with a 100 μm pitch. The released device was able to capture 300 mN force without damage. Thicker protection layers or stiffer materials can increase this critical force for damage at a compromised sensitivity and spatial resolution.

The present TFT array transduces normal and shear forces and force sensors have many applications, including in closed loop robotic systems (industrial, medical, etc.). Some piezoelectric materials that can be used in the present sensors and sensor arrays, e.g. ZnO, also can detect radiation such as radiation. This provides the opportunity to combine flexible force sensing and imaging in a common array which can be readily integrated in flexible and wearable electronics.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A flexible thin film transistor tactile sensor, comprising: a piezoelectric semiconductor thin film channel made of a material with a conductivity that can be electrostatically controlled, the piezoelectric semiconductor thin film channel being connected with a source metal and a drain metal and being sandwiched between a bottom thin film insulator and a top thin film insulator and at least one of a bottom gate metal and a top gate metal, the flexible thin film transistor tactile sensor being supported on a flexible substrate.

2. The flexible thin film transistor tactile sensor of claim 1, wherein the piezoelectric semiconductor thin film channel has a thickness of 1-1000 nm.

3. The flexible thin film transistor tactile sensor of claim 1, wherein the material comprises ZnO, GaN or other polar materials with a polar plane aligned parallel to a surface of the flexible substrate.

4. The flexible thin film transistor tactile sensor of claim 1, formed as a mesa structure with the piezoelectric semiconductor thin film channel centrally located and vertically aligned with dual gates.

5. The flexible thin film transistor tactile sensor of claim 1, formed as a mesa structure with the piezoelectric semiconductor thin film channel centrally located and vertically aligned with the bottom gate metal and/or the top gate metal.

6. The flexible thin film transistor tactile sensor of claim 5, wherein the source metal and the drain metal are formed on the bottom thin film insulator, with a separation between the source metal and the drain metal to leave an opening for a central portion of the material to contact the bottom thin film insulator between ends of the source metal and the drain metal.

7. The flexible thin film transistor tactile sensor of claim 6, wherein the top thin film insulator leaves exposed a portion of the source metal and the drain metal for interconnection.

8. The flexible thin film transistor tactile sensor of claim 1, wherein the flexible substrate comprises polyimide.

9. The flexible thin film transistor tactile sensor of claim 1, wherein the flexible substrate comprises polydimethylsiloxane (PDMS).

10. The flexible thin film transistor tactile sensor of claim 9, wherein the PDMS further packages the flexible thin film transistor tactile sensor as a protection layer.

11. The flexible thin film transistor tactile sensor of claim 1, comprising a Parylene-C protection layer.

12. The flexible thin film transistor tactile sensor of claim 1, comprising a Parylene-C protection layer, wherein the source metal and the drain metal comprise thin films.

13. The flexible thin film transistor tactile sensor of claim 1, wherein the flexible substrate comprises polyimide, the flexible thin film transistor tactile sensor further comprising a cover layer.

14. The flexible thin film transistor tactile sensor of claim 1 grouped with three additional sensors to form a group of four sensors to provide shear force sensing, comprising a polymer pillar formed over the group of four sensors.

15. The flexible thin film transistor tactile sensor of claim 14, wherein the polymer pillar comprises an L-shaped tip.

16. The flexible thin film transistor tactile sensor of claim 14, wherein the polymer pillar comprises a tip that is at least 25% smaller than the base of the polymer pillar.

17. A tactile sensor array comprising a plurality of transistors of claim 1 arranged in an m×n thin film transistor (TFT) array, with m source electrodes spanning shared by sources of m TFTs in a row and n gate electrodes shared by gates of n TFTs in a column.

18. A tactile sensor array system including a transistor of claim 1 and read-out circuitry, wherein the read-out circuitry comprises:

a gate controller configured to turn on selected ones of n gate electrodes;

amplifiers configured to amplify signals from m source electrodes; a multiplexor to multiplex signals from the m source electrodes; an analog to digital converter to convert signals from the m source electrodes; and a controller configured to control the read-out circuitry to conduct read-out of sensed force encountered by the tactile sensor array system.

19. The tactile sensor array system of claim 18, further comprising a computer interfaced with the controller, the computer being configured to analyze date from the tactile sensor array system.

20. The tactile sensor array system of claim 18, comprising a computer interfaced with the controller, the computer being configured to analyze data from the tactile sensor array system, the tactile sensor array system being applied to multiple robot appendages for controlling the robot appendages, the robot appendages being controlled by a control system that controls a force applied by the appendages in real-time.

21. The tactile sensor array system of claim 20, wherein the robot appendages are gripper arms, and the controller evaluates average normal force applied and adjusts grip in response to maintain a predetermined normal force.

22. The tactile sensor array system of claim 21, wherein the controller increases the grip in response to a detected slip based upon shear force evaluation.

* * * * *